US012610610B2

(12) United States Patent
Tang et al.

(10) Patent No.: US 12,610,610 B2
(45) Date of Patent: Apr. 21, 2026

(54) POWER DEVICE AND METHOD FOR MANUFACTURING THE SAME

(71) Applicants: NIKO SEMICONDUCTOR CO., LTD., New Taipei City (TW); SUPER GROUP SEMICONDUCTOR CO., LTD., Hsinchu County (TW)

(72) Inventors: Sung-Nien Tang, Hsinchu County (TW); Ho-Tai Chen, Hsinchu County (TW); Hsiu-Wen Hsu, Hsinchu County (TW)

(73) Assignees: NIKO SEMICONDUCTOR CO., LTD., New Taipei City (TW); SUPER GROUP SEMICONDUCTOR CO., LTD., Hsinchu County (TW)

( * ) Notice: Subject to any disclaimer, the term of this patent is extended or adjusted under 35 U.S.C. 154(b) by 435 days.

(21) Appl. No.: 18/119,364

(22) Filed: Mar. 9, 2023

(65) Prior Publication Data

US 2024/0204095 A1    Jun. 20, 2024

(30) Foreign Application Priority Data

Dec. 14, 2022    (TW) .................................. 111147908

(51) Int. Cl.

| | |
|---|---|
| *H10D 30/66* | (2025.01) |
| *H01L 21/02* | (2006.01) |
| *H01L 21/04* | (2006.01) |
| *H10D 12/01* | (2025.01) |
| *H10D 62/10* | (2025.01) |
| *H10D 62/832* | (2025.01) |
| *H10D 64/23* | (2025.01) |
| *H10D 84/00* | (2025.01) |

(52) U.S. Cl.
CPC ..... *H10D 84/146* (2025.01); *H01L 21/02236* (2013.01); *H01L 21/046* (2013.01); *H10D 12/031* (2025.01); *H10D 30/668* (2025.01); *H10D 62/109* (2025.01); *H10D 62/8325* (2025.01); *H10D 64/252* (2025.01)

(58) Field of Classification Search
CPC ........... H10D 30/0295; H10D 30/0297; H10D 30/668; H10D 62/107; H10D 62/109; H10D 62/157; H10D 62/393; H10D 62/8325; H10D 64/252; H10D 64/2527
USPC ............................................................ 257/77
See application file for complete search history.

(56) References Cited

U.S. PATENT DOCUMENTS

| | | | |
|---|---|---|---|
| 2004/0021173 A1* | 2/2004 | Sapp | .................... H10D 30/668 |
| | | | 257/330 |
| 2013/0082324 A1 | 4/2013 | Lin et al. | |
| 2013/0306983 A1* | 11/2013 | Nakano | ................ H10D 64/513 |
| | | | 438/270 |

(Continued)

FOREIGN PATENT DOCUMENTS

TW        M436937 U1      9/2012

*Primary Examiner* — Fazli Erdem
(74) *Attorney, Agent, or Firm* — Li & Cai Intellectual Property (USA) Office

(57) ABSTRACT

A power device and a method for manufacturing the power device are provided. The power device includes an electrical substrate, an epitaxial layer, a well region, a plurality of doping regions, a plurality of trenches, a first oxidation layer, a second oxidation layer, a polycrystalline silicon filler, two shielding regions, a dielectric layer, and a metallic electrically conductive layer.

5 Claims, 10 Drawing Sheets

(56) References Cited

U.S. PATENT DOCUMENTS

| | | | |
|---|---|---|---|
| 2014/0167151 A1* | 6/2014 | Yen ..................... | H10D 30/635 |
| | | | 438/270 |
| 2019/0181233 A1 | 6/2019 | Blank | |
| 2023/0187486 A1* | 6/2023 | Nakagawa ........... | H10D 64/117 |
| | | | 257/77 |

* cited by examiner

S100

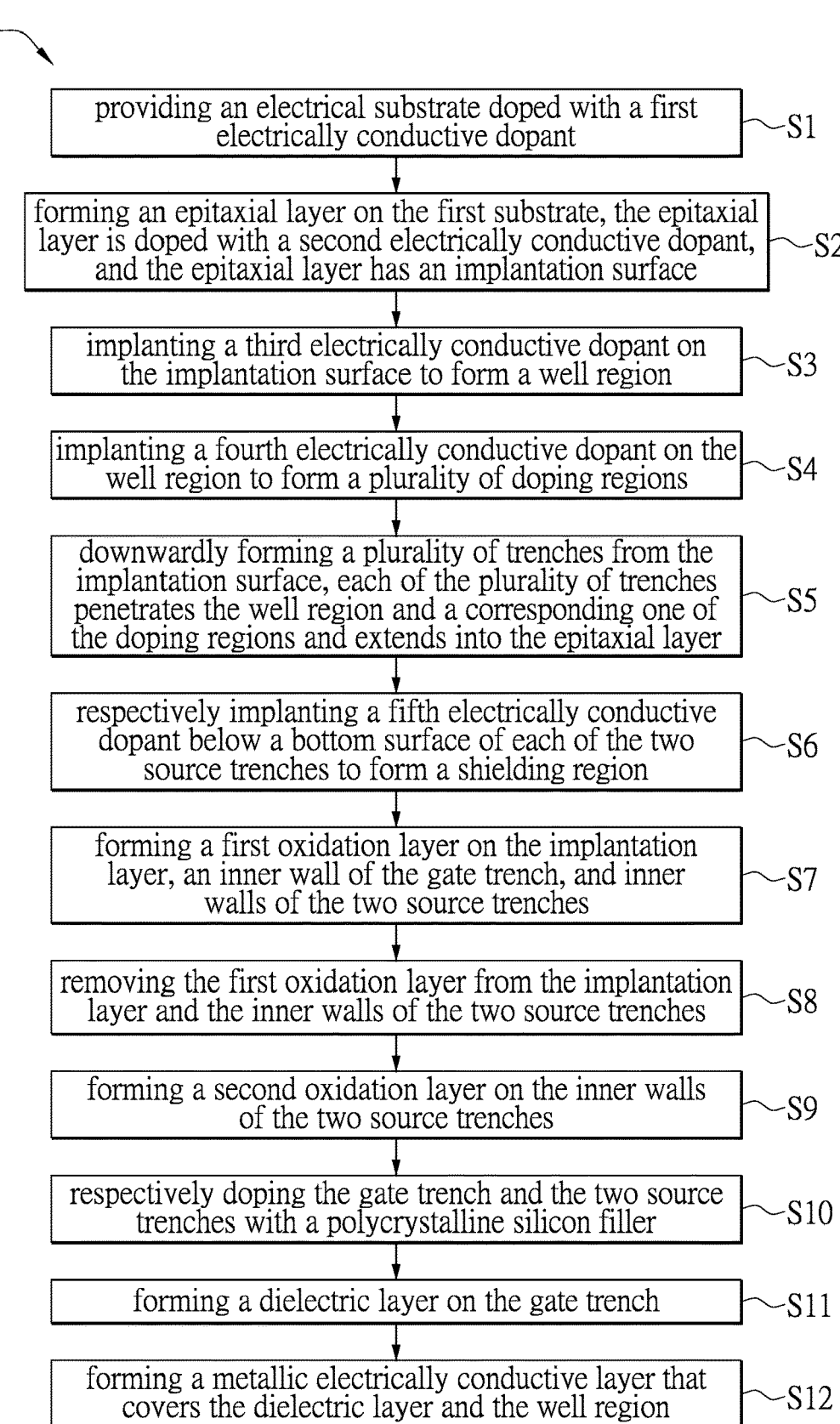

| | |
|---|---|
| providing an electrical substrate doped with a first electrically conductive dopant | S1 |
| forming an epitaxial layer on the first substrate, the epitaxial layer is doped with a second electrically conductive dopant, and the epitaxial layer has an implantation surface | S2 |
| implanting a third electrically conductive dopant on the implantation surface to form a well region | S3 |
| implanting a fourth electrically conductive dopant on the well region to form a plurality of doping regions | S4 |
| downwardly forming a plurality of trenches from the implantation surface, each of the plurality of trenches penetrates the well region and a corresponding one of the doping regions and extends into the epitaxial layer | S5 |
| respectively implanting a fifth electrically conductive dopant below a bottom surface of each of the two source trenches to form a shielding region | S6 |
| forming a first oxidation layer on the implantation layer, an inner wall of the gate trench, and inner walls of the two source trenches | S7 |
| removing the first oxidation layer from the implantation layer and the inner walls of the two source trenches | S8 |
| forming a second oxidation layer on the inner walls of the two source trenches | S9 |
| respectively doping the gate trench and the two source trenches with a polycrystalline silicon filler | S10 |
| forming a dielectric layer on the gate trench | S11 |
| forming a metallic electrically conductive layer that covers the dielectric layer and the well region | S12 |

MCD

POWER DEVICE AND METHOD FOR MANUFACTURING THE SAME

CROSS-REFERENCE TO RELATED PATENT APPLICATION

This application claims the benefit of priority to Taiwan Patent Application No. 111147908, filed on Dec. 14, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power device, and more particularly to a metal oxide semiconductor field-effect transistor that includes a channel diode power device.

BACKGROUND OF THE DISCLOSURE

As metal oxide semiconductor field-effect transistors (MOSFETs) are widely applied in power switch devices, a silicon carbide (SiC) trench technology has recently been adopted in electric vehicles and solar inverters.

However, for a MOSFET that uses silicon carbide as a substrate, a forward-bias voltage on a P-N junction is greater (i.e., substantially from 2 eV to 3 eV) when the MOSFET is used in power devices. For a MOSFET that use silicon as a substrate, a voltage required to turn on the circuit is lower.

Therefore, how to improve the efficiency of the MOSFETs that adopts silicon carbide substrates through structural modifications has become one of the important issues to be addressed in the relevant industry.

SUMMARY OF THE DISCLOSURE

In response to the above-referenced technical inadequacies, the present disclosure provides a power device and a method for manufacturing the power device.

In one aspect, the present disclosure provides a method for manufacturing a power device. The method includes steps as follows: providing an electrical substrate that is doped with a first electrically conductive dopant, and the electrical substrate having a first surface and a second surface that is opposite to the first surface; forming an epitaxial layer on the first surface, the epitaxial layer being doped with a second electrically conductive dopant that has same electrical charges as the first electrically conductive dopant, a concentration of the second electrically conductive dopant being lower than a concentration of the first electrically conductive dopant, and the epitaxial layer having an implantation surface; implanting a third electrically conductive dopant on the implantation surface to form a well region, and the third electrically conductive dopant and the first electrically conductive dopant having different electrical charges; implanting a fourth electrically conductive dopant on the well region to form a plurality of doping regions, any two adjacent ones of the doping regions being spaced apart from each other, and the fourth electrically conductive dopant and the first electrically conductive dopant having same electrical charges; downwardly forming a plurality of trenches from the implantation surface, each of the plurality of trenches penetrating the well region and a corresponding one of the doping regions and extending into the epitaxial layer, in which out of three adjacent ones of the trenches, the trench that is located in middle being defined as a gate trench, and the two trenches that are located at two sides of the gate trench being each defined as a source trench; respectively implanting a fifth electrically conductive dopant below a bottom surface of each of the two source trenches to form a shielding region, and the fifth electrically conductive dopant and the first electrically conductive dopant having different electrical charges; forming a first oxidation layer on the implantation layer, an inner wall of the gate trench, and inner walls of the two source trenches; removing the first oxidation layer from the implantation layer and the inner walls of the two source trenches; forming a second oxidation layer on the inner walls of the two source trenches, and a thickness of the second oxidation layer being less than a thickness of the first oxidation layer; respectively doping the gate trench and the two source trenches with a polycrystalline silicon filler, so as to form a gate region in the gate trench and form a source region in each of the two source trenches; forming a dielectric layer on the gate trench; and forming a metallic electrically conductive layer that covers the dielectric layer and the well region.

In certain embodiments, the well region is plural in number, and two adjacent ones of the well regions are spaced apart by a gap.

In certain embodiments, the electrical substrate is a silicon carbide substrate, and the first electrically conductive dopant is an N-type dopant.

In certain embodiments, the thickness of the first oxidation layer is from 40 nm to 60 nm, and the thickness of the second oxidation layer is from 1 nm to 10 nm.

In certain embodiments, the gap is from 0.5 μm to 5 μm, a depth of each of the trenches is from 0.5 μm to 5 μm, and a width of each of the trenches is from 0.3 μm to 3 μm.

In another aspect, the present disclosure provides a power device. The power device includes an electrical substrate, an epitaxial layer, a well region, a plurality of doping regions, a plurality of trenches, a first oxidation layer, a second oxidation layer, a polycrystalline silicon filler, two shielding regions, a dielectric layer, and a metallic electrically conductive layer. The electrical substrate is doped with a first electrically conductive dopant, and the electrical substrate has a first surface and a second surface that is opposite to the first surface. The epitaxial layer is located on the first surface. The epitaxial layer is doped with a second electrically conductive dopant that has same electrical charges as the first electrically conductive dopant, and a concentration of the second electrically conductive dopant is lower than a concentration of the first electrically conductive dopant. The epitaxial layer has an implantation surface. The well region is located below the implantation region and doped with a third electrically conductive dopant. The third electrically conductive dopant and the first electrically conductive dopant have different electrical charges. The plurality of doping regions are located in the well region and doped with a fourth electrically conductive dopant. The fourth electrically conductive dopant and the first electrically conductive dopant have same electrical charges, and any two adjacent ones of the doping regions are spaced apart from each other. Each of the plurality of trenches penetrates downwardly from the implantation surface and through the well region and the doping region and protrudes out from the well region. In three adjacent ones of the trenches, the trench that is located in middle is defined as a gate trench, and the two trenches that are located at two sides of the gate trench are each defined as a source trench. The first oxidation layer is located on an inner wall of the gate trench. The second oxidation layer is located on inner walls of the two source trenches. A thickness of the second oxidation layer is less than a thickness of the first oxidation layer. The polycrystalline silicon filler is filled in the gate trench and the two source trenches to form a gate region in the gate trench and form a source region in each of the two source trenches. The two shielding regions respectively are located below bottom surfaces of the two source trenches. Each of the two shielding regions is doped with a fifth electrically conductive dopant, and the fifth electrically conductive dopant and the first electrically conductive dopant have different electrical charges. The dielectric layer is located on the gate trench. The metallic electrically conductive layer covers the dielectric layer and the well region.

Therefore, in the power device and the method for manufacturing the power device of the present disclosure, by virtue of "implanting a fifth electrically conductive dopant below a bottom surface of the source trench to form a shielding region," a piezoelectric field below a source and a gate can be decreased.

Furthermore, in the power device and the method for manufacturing the power device of the present disclosure, by virtue of "forming a metallic channel diode (to be described in further detail below) by using the metallic electrically conductive layer, the well region, the doping regions, the source regions, the shielding regions, the epitaxial layer, and the electrical substrate," the metallic channel diode having a lower threshold voltage can be used in place of the P-N junction of a silicon carbide metal oxide semiconductor field-effect transistor, so that a forward bias of the source can be decreased.

Moreover, in the power device and the method for manufacturing the power device of the present disclosure, by virtue of "the well region being plural in number, and a Schottky diode (to be described in further detail below) being formed by the metallic electrically conductive layer, a region between two well regions, the epitaxial layer, and the electrical substrate," the Schottky diode has a forward bias that is lower than 1.7 V, so that a turn-on voltage required by the circuitry of the power device may be lowered.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 1 is a schematic flowchart of a method for manufacturing a power device according to one embodiment of the present disclosure;

DETAILED DESCRIPTION OF THE EXEMPLARY EMBODIMENTS

Figure 2:
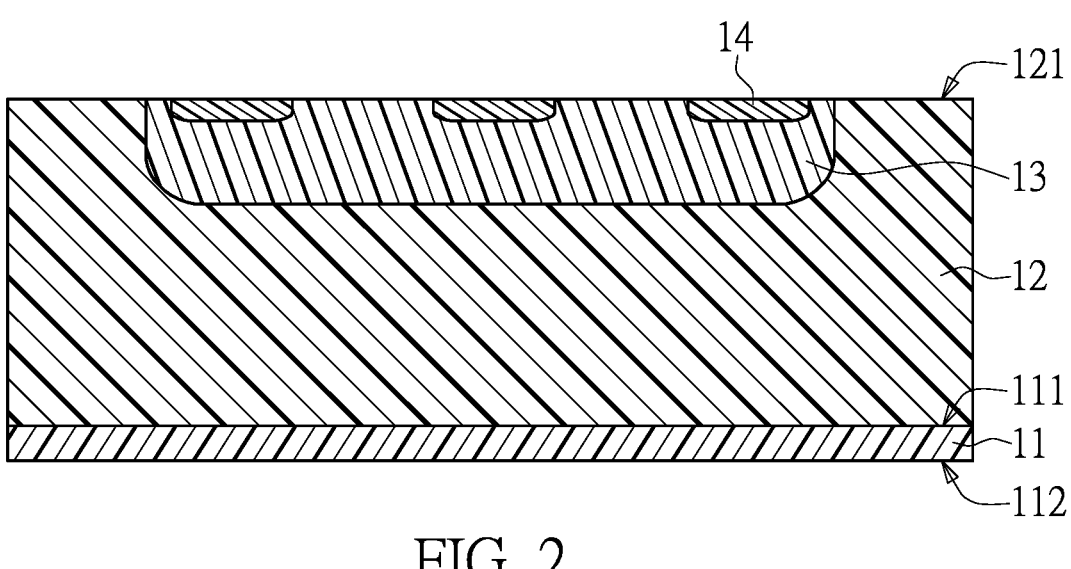
FIG. 2 is a schematic view of step S1 to step S4 of the flowchart according to the embodiment shown in FIG. 1.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

EMBODIMENTS

Figure 3:
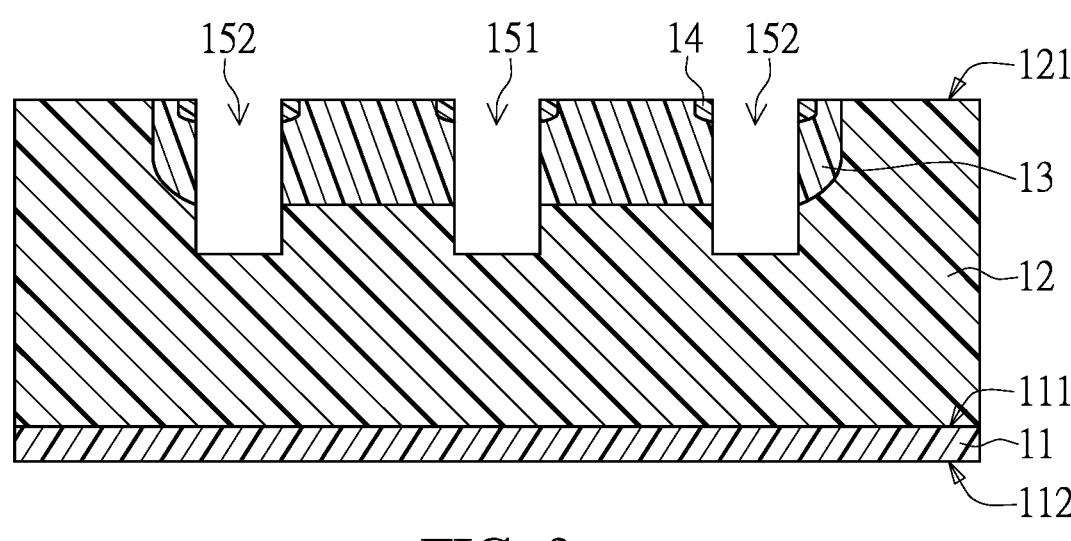
FIG. 3 is a schematic view of step S5 of the flowchart according to the embodiment shown in FIG. 1.
Figure 4:
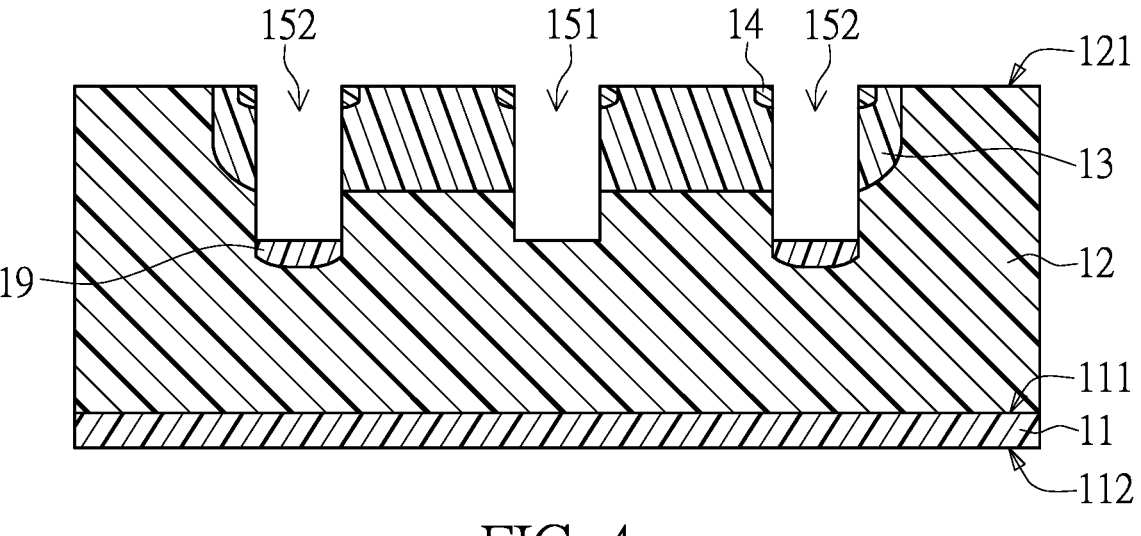
FIG. 4 is a schematic view of step S6 of the flowchart according to the embodiment shown in FIG. 1.
Figure 5:
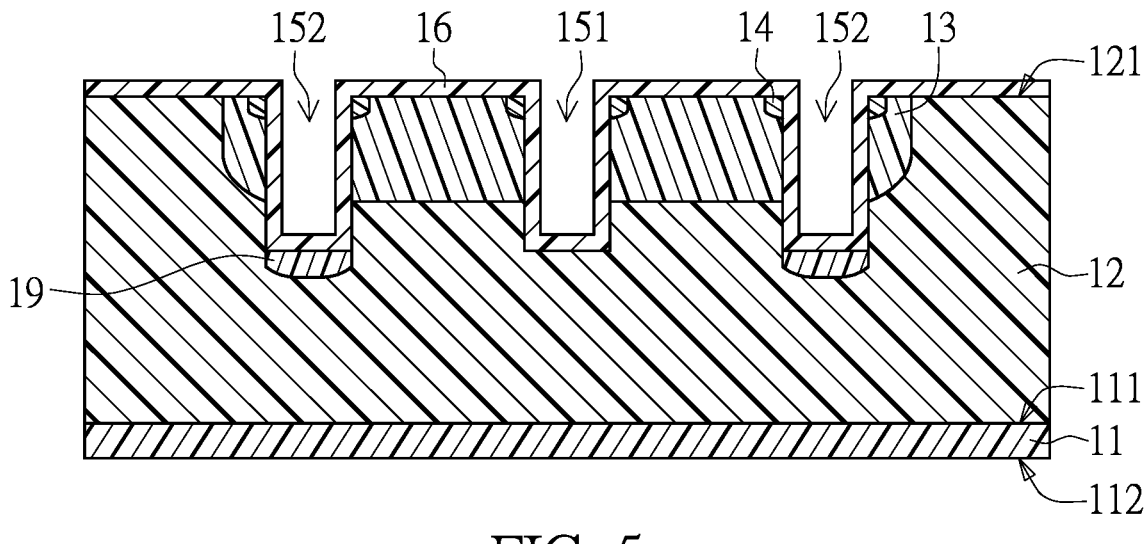
FIG. 5 is a schematic view of step S7 of the flowchart according to the embodiment shown in FIG. 1.
Figure 6:
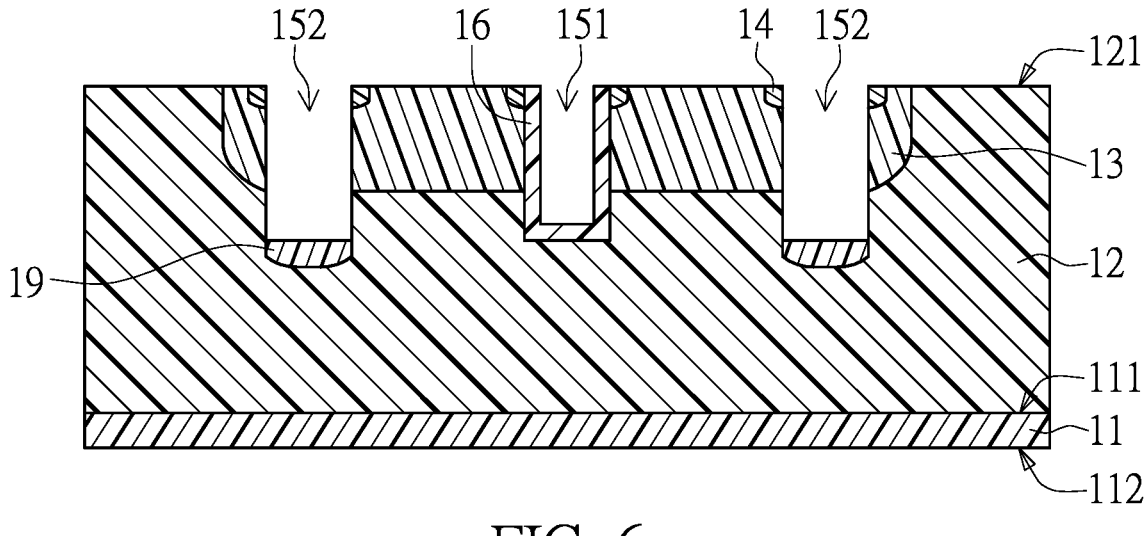
FIG. 6 is a schematic view of step S8 of the flowchart according to the embodiment shown in FIG. 1.
Figure 7:
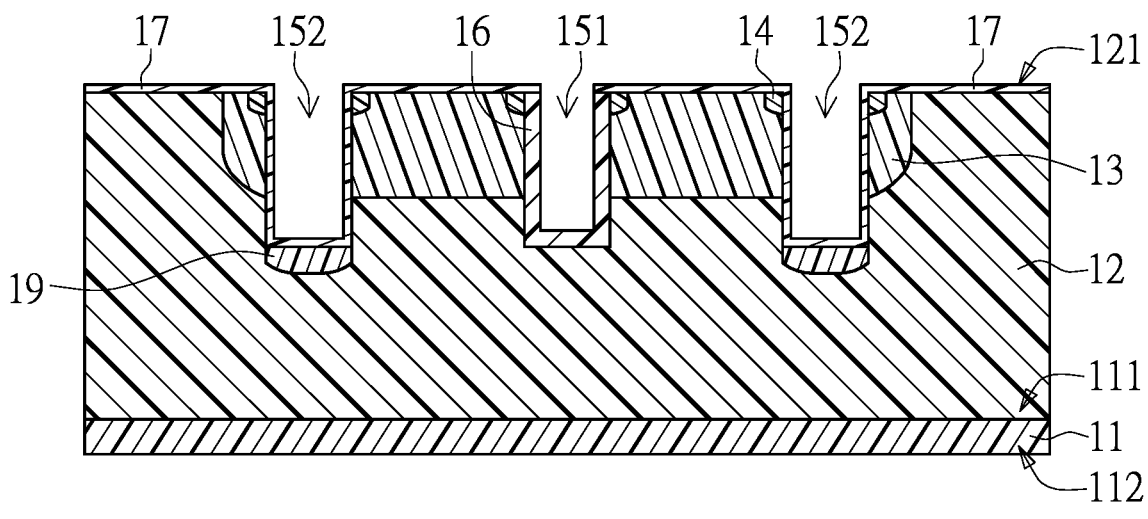
FIG. 7 is a schematic view of step S9 of the flowchart according to the embodiment shown in FIG. 1.
Figure 8:
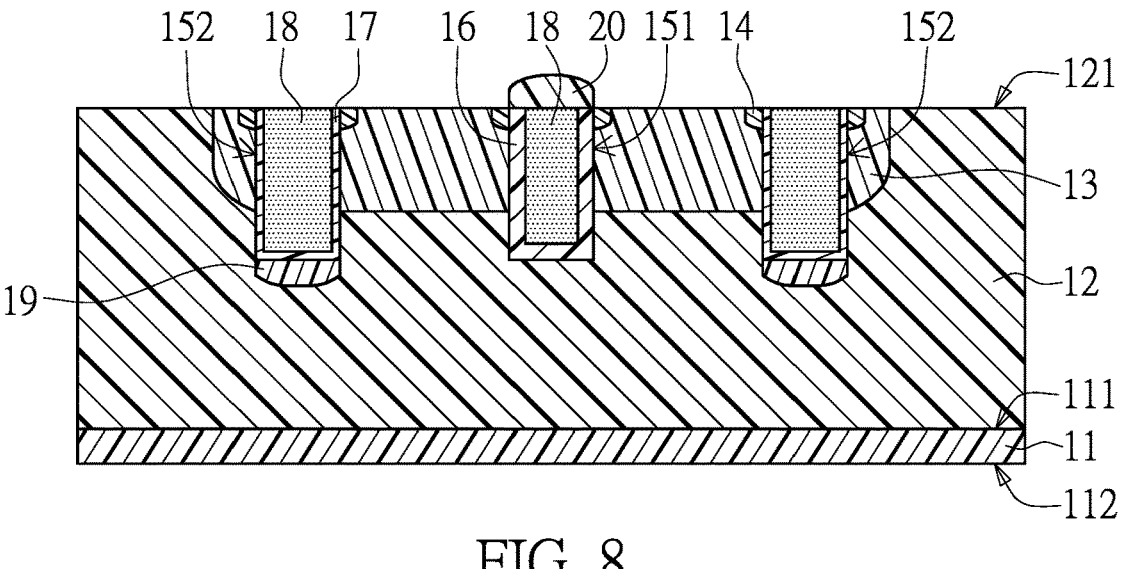
FIG. 8 is a schematic view of step S10 of the flowchart according to the embodiment shown in FIG. 1.
Figure 9:
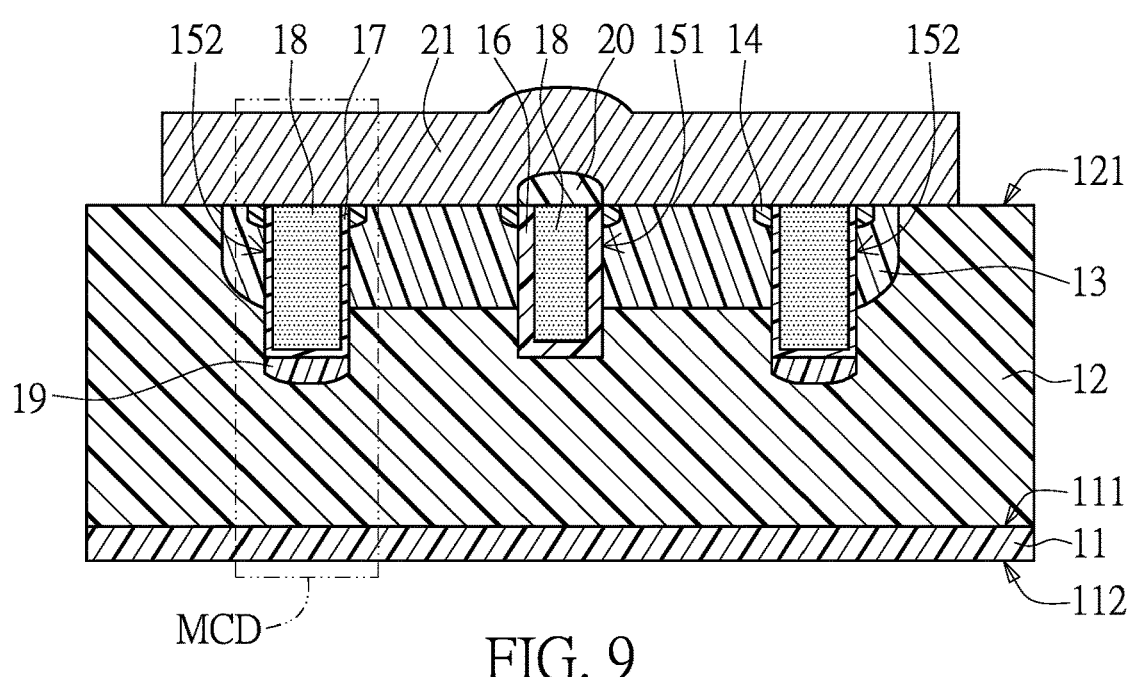
FIG. 9 is a schematic view of step S11 and step S12 of the flowchart according to the embodiment shown in FIG. 1.

Referring to FIG. 1, FIG. 1 is a schematic flowchart of a method for manufacturing a power device 1 according to one embodiment of the present disclosure. Reference is made to FIG. 2 to FIG. 9, and FIG. 2 is a schematic view of step S1 to step S4 of the flowchart according to the embodiment as shown in FIG. 1. FIG. 3 is a schematic view of step S5 of the flowchart according to the embodiment as shown in FIG. 1. FIG. 4 is a schematic view of step S6 of the flowchart according to the embodiment as shown in FIG. 1. FIG. 5 is a schematic view of step S7 of the flowchart according to the embodiment as shown in FIG. 1. FIG. 6 is a schematic view of step S8 of the flowchart according to the embodiment as shown in FIG. 1. FIG. 7 is a schematic view of step S9 of the flowchart according to the embodiment as shown in FIG. 1. FIG. 8 is a schematic view of step S10 of the flowchart according to the embodiment as shown in FIG. 1. FIG. 9 is a schematic view of step S11 and step S12 of the flowchart according to the embodiment as shown in FIG. 1.

A method 100 for manufacturing a power device 1 according to the present disclosure includes steps as follows. Step S1: providing an electrical substrate 11 that is doped with a first electrically conductive dopant, and the electrical substrate 11 having a first surface 111 and a second surface 112 that is opposite to the first surface 111. Step S2: forming an epitaxial layer 12 on the first surface 111, the epitaxial layer 12 being doped with a second electrically conductive dopant that has same electrical charges as the first electrically conductive dopant, a concentration of the second electrically conductive dopant being lower than a concentration of the first electrically conductive dopant, and the epitaxial layer 12 having an implantation surface 121. Step S3: implanting a third electrically conductive dopant on the implantation surface 121 to form a well region 13, and the third electrically conductive dopant and the first electrically conductive dopant having different electrical charges. Step S4: implanting a fourth electrically conductive dopant on the well region 13 to form a plurality of doping regions 14, any two adjacent ones of the doping regions 14 being spaced apart from each other, and the fourth electrically conductive dopant and the first electrically conductive dopant having same electrical charges. Step S5: downwardly forming a plurality of trenches 15 from the implantation surface 121, each of the plurality of trenches 15 penetrating the well region 13 and a corresponding one of the doping regions 14 and extending into the epitaxial layer 12, in which out of three adjacent ones of the trenches 15, the trench 15 that is located in middle being defined as a gate trench 151, and the two trenches 15 that are located at two sides of the gate trench 151 being each defined as a source trench 152. Step S6: respectively implanting a fifth electrically conductive dopant below a bottom surface of each of the two source trenches 152 to form a shielding region 19, and the fifth electrically conductive dopant and the first electrically conductive dopant having different electrical charges. Step S7: forming a first oxidation layer 16 on the implantation layer 121, an inner wall of the gate trench 151, and inner walls of the two source trenches 152. Step S8: removing the first oxidation layer 16 from the implantation layer 121 and the inner walls of the two source trenches 152. Step S9: forming a second oxidation layer 17 on the inner walls of the two source trenches 152, and a thickness of the second oxidation layer 17 being less than a thickness of the first oxidation layer 16. Step S10: respectively doping the gate trench 151 and the two source trenches 152 with a polycrystalline silicon filler 18, so as to form a gate region in the gate trench 151 and form a source region in each of the two source trenches 152. Step S11: forming a dielectric layer 20 on the gate trench 151. Step S12: forming a metallic electrically conductive layer 21 that covers the dielectric layer 20 and the well region 13.

As shown in FIG. 2, step S1 to step S4 of FIG. 1 are shown in FIG. 2. The electrical substrate 11 is doped with the first electrically conductive dopant, and the electrical substrate 11 has a first surface 111 and a second surface 112 that is opposite to the first surface 111. The electrical substrate 11 can be a silicon carbide (SiC) substrate, but is not limited thereto. According to certain embodiments, the first electrically conductive dopant is an N-type dopant, such as phosphorus, antimony, or arsenic. The second electrically conductive dopant has the same electrical charges as the first electrically conductive dopant, and a concentration of the second electrically conductive dopant is lower than a concentration of the first electrically conductive dopant. According to certain embodiment, a concentration of the second electrically conductive dopant is from $1\times10^{16}/cm^3$ to $1\times10^{19}/cm^3$. An electrode layer can be disposed on the second surface 112 of the electrical substrate 11 to be used as a drain in the power device 1. The epitaxial layer 12 has an implantation surface 121, and a third electrically conductive dopant is implanted on the implantation surface 121 to form a well region 13. The third electrically conductive dopant and the first electrically conductive dopant have different electrical charges. According to certain embodiments, the third electrically conductive dopant is a P-type dopant, such as boron, aluminum, gallium, or indium. According to certain embodiment, a concentration of the third electrically conductive dopant is from $1\times10^{16}/cm^3$ to $1\times10^{18}/cm^3$. The term "implanting" can indicate diffusion implanting, in certain embodiments, implanting indicates ion beam doping. The doping region 14 is used to lower impedances in source regions and gate regions (as described in detail below).

As shown in FIG. 3, each of the trenches 15 penetrates downwardly through the well region 13 and a corresponding one of the doping regions 14, and extends into the epitaxial layer 12. Three adjacent ones of the trenches 15 are exemplified to describe the functions of the trenches 15, in which the trench 15 that is located in middle is defined as the gate trench 151, and the two trenches 15 that are located at two sides of the gate trench 151 are each defined as a source trench 152. That is, in one arrangement sequence, the gate trench 151 and the source trench 152 are alternately arranged.

As shown in FIG. 4, the fifth electrically conductive dopant is implanted below the bottom surface of each of the two source trenches 152 to form the shielding region 19, and the fifth electrically conductive dopant and the first electrically conductive dopant have different electrical charges. For example, the first electrically conductive dopant is an N-type dopant, and the fifth electrically conductive dopant is a P-type dopant. The shielding region 19 shields the source regions (as described in detail below) to improve on the distribution of electrical fields and decrease a piezoelectric field.

As shown in FIG. 5, the first oxidation layer 16 is located on the implantation layer 121, an inner wall of the gate trench 151, and inner walls of the two source trenches 152. According to one embodiment, the first oxidation layer 16 is made of silicon dioxide $(SiO_2)$ via thermal oxidation or chemical vapor deposition, and the present disclosure is not limited thereto.

As shown in FIG. 6, in step S8, the first oxidation layer 16 on the inner wall of the gate trench 151 is retained, and the first oxidation layer 16 on the implantation layer 121 and the inner walls of the two source trenches 152 are removed. The first oxidation layer 16 on the implantation layer 121 and the inner walls of the two source trenches 152 can be removed by disposing a photoresist and a photomask and performing photolithography.

As shown in FIG. 7, the second oxidation layer 17 is located on the inner walls of the two source trenches 152. According to one embodiment, the second oxidation layer 17 is made of silicon dioxide ($SiO_2$) via thermal oxidation or chemical vapor deposition, and the present disclosure is not limited thereto. A thickness of the second oxidation layer 17 is less than a thickness of the first oxidation layer 16. According to one embodiment, the thickness of the first oxidation layer 16 is from 40 nm to 60 nm, and the thickness of the second oxidation layer 17 is from 1 nm to 10 nm.

As shown in FIG. 8, in the three trenches 15 that are sequentially arranged, the gate trench 151 and the two source trenches 152 are each doped with the polycrystalline silicon filler 18, so as to form the gate region in the gate trench 151 and form the source region in each of the two source trenches 152, respectively. According to certain embodiments, after doping with the polycrystalline silicon filler 18, portions of the polycrystalline silicon filler 18 and the second oxidation layer 17 that protrude from the implantation surface 121 are removed by etching or chemical-mechanical planarization. The aforementioned shielding region 19 is located below the source region, and the shielding region 19 can change the distribution of electrical fields and decrease a piezoelectric field. The dielectric layer 20 is located on the implanting surface 121. According to certain embodiments, the dielectric layer 20 is formed on the implanting surface 121 via chemical vapor deposition. Furthermore, the dielectric layer 20 formed on the implanting surface 121 that is not located on a position above the gate trench 151 is removed, so that the dielectric layer 20 is only located on the position above the gate trench 151.

As shown in FIG. 9, the metallic electrically conductive layer 21 is located on the implanting surface 121, and the metallic electrically conductive layer 21 covers the dielectric layer 20 and the well region 13. In a vertical direction, the metallic electrically conductive layer 21, the well region 13, the doping region 14, the source region, the shielding region 19, the epitaxial layer 12, and the electrical substrate 11 form a metal-oxide-semiconductor channel diode (also called an MOS channel diode or MCD) that has a threshold voltage lower than 2 V. By the design of the MOS channel diode, a P-N junction structure in a silicon carbide metal oxide semiconductor field-effect transistor (MOSFET) can be replaced, and a forward bias of the source can be decreased. In other words, a turn-on voltage required by the circuitry of the power device 1 may be lowered.

Figure 10:
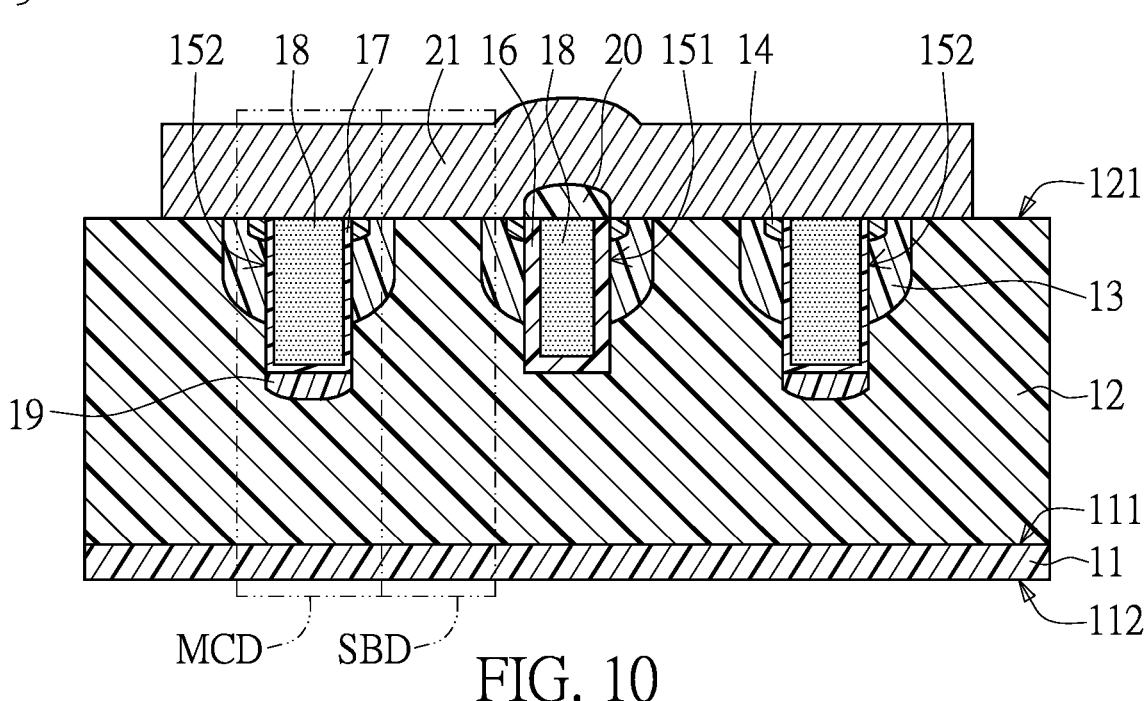
FIG. 10 is a schematic cross-sectional view of a power device according to one embodiment of the present disclosure.

Referring to FIG. 10, FIG. 10 is a schematic cross-sectional view of the power device 1 according to one embodiment of the present disclosure. In the aforementioned step S3, the well region 13 is plural in number, and two adjacent ones of the well regions 13 are spaced apart by a gap, as shown in FIG. 10. At this time, in addition to the aforementioned MOS channel diode, the power device 1 of the present disclosure further has a Schottky diode (SBD) in the vertical direction that is formed by the metallic electrically conductive layer 21, a region between two well regions 13, the epitaxial layer 12, and the electrical substrate 11. The Schottky diode has a forward bias that is lower than 1.7 V, so that a turn-on voltage required by the circuitry of the power device 1 may be lowered. Performances of the MOS channel diode and the SBD will be affected by the gap between the two well regions 13 and depths and widths of the trenches 15. In certain embodiments, the aforementioned gap is from 0.5 µm to 5 µm, depth of the trenches 15 are from 0.5 µm to 5 µm, and widths of the trenches 15 are from 0.3 µm to 3 µm. However, the present disclosure is not limited thereto.

Reference is further made to FIG. 9, in which the present disclosure further provides a power device 1. The power device 1 includes the electrical substrate 11, the epitaxial layer 12, the well region 13, the plurality of doping regions 14, the plurality of trenches 15, the first oxidation layer 16, the second oxidation layer 17, the polycrystalline silicon filler 18, the two shielding regions 19, the dielectric layer 20, and the metallic electrically conductive layer 21. Detailed descriptions regarding the electrical substrate 11, the epitaxial layer 12, the well region 13, the plurality of doping regions 14, the plurality of trenches 15, the first oxidation layer 16, the second oxidation layer 17, the polycrystalline silicon filler 18, the two shielding regions 19, the dielectric layer 20, and the metallic electrically conductive layer 21 can be referred to in the abovementioned descriptions, and will not be reiterated herein.

Figure 11:
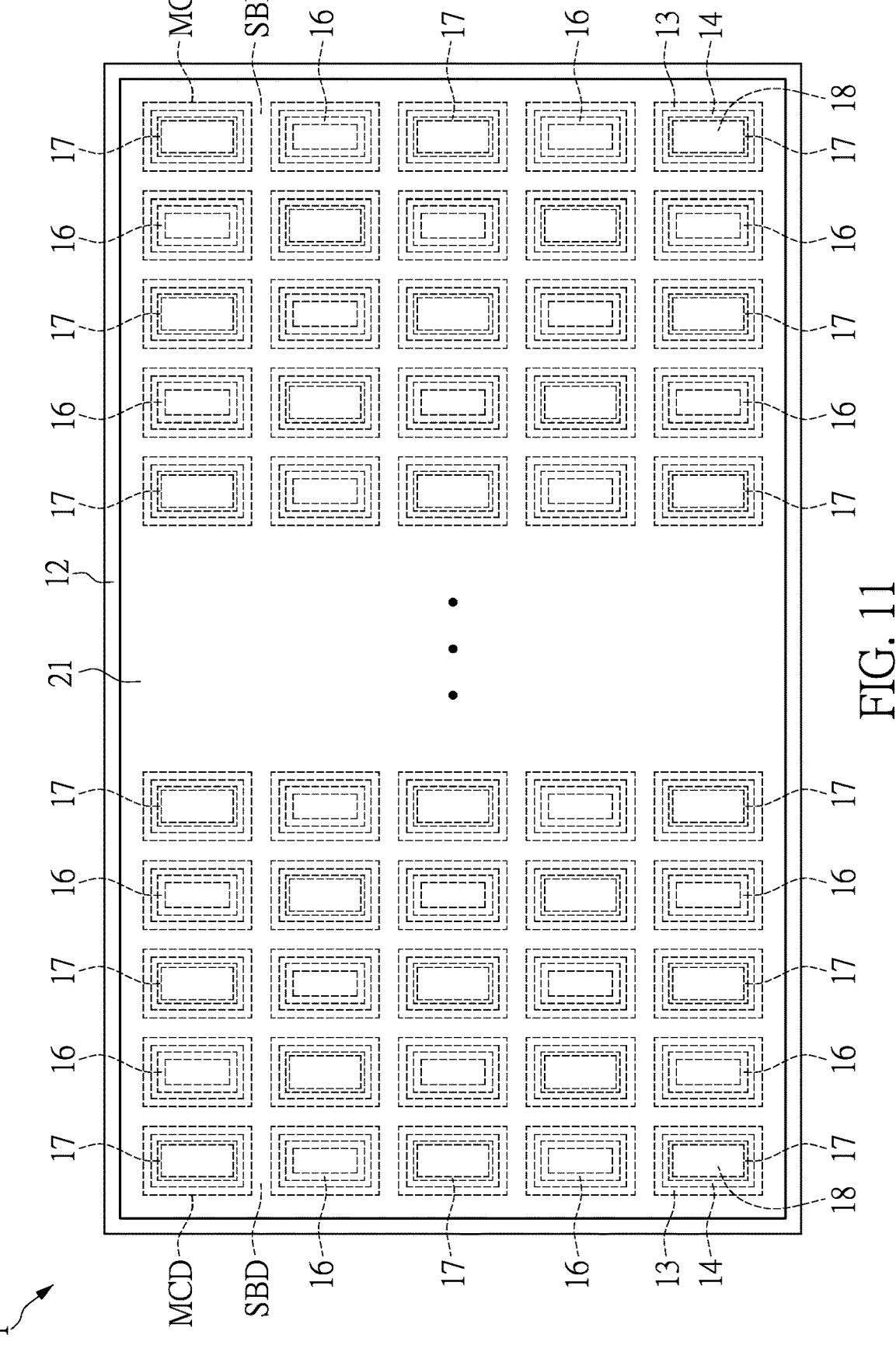
FIG. 11 is a schematic top view of the power device according to one embodiment of the present disclosure.
Figure 12:
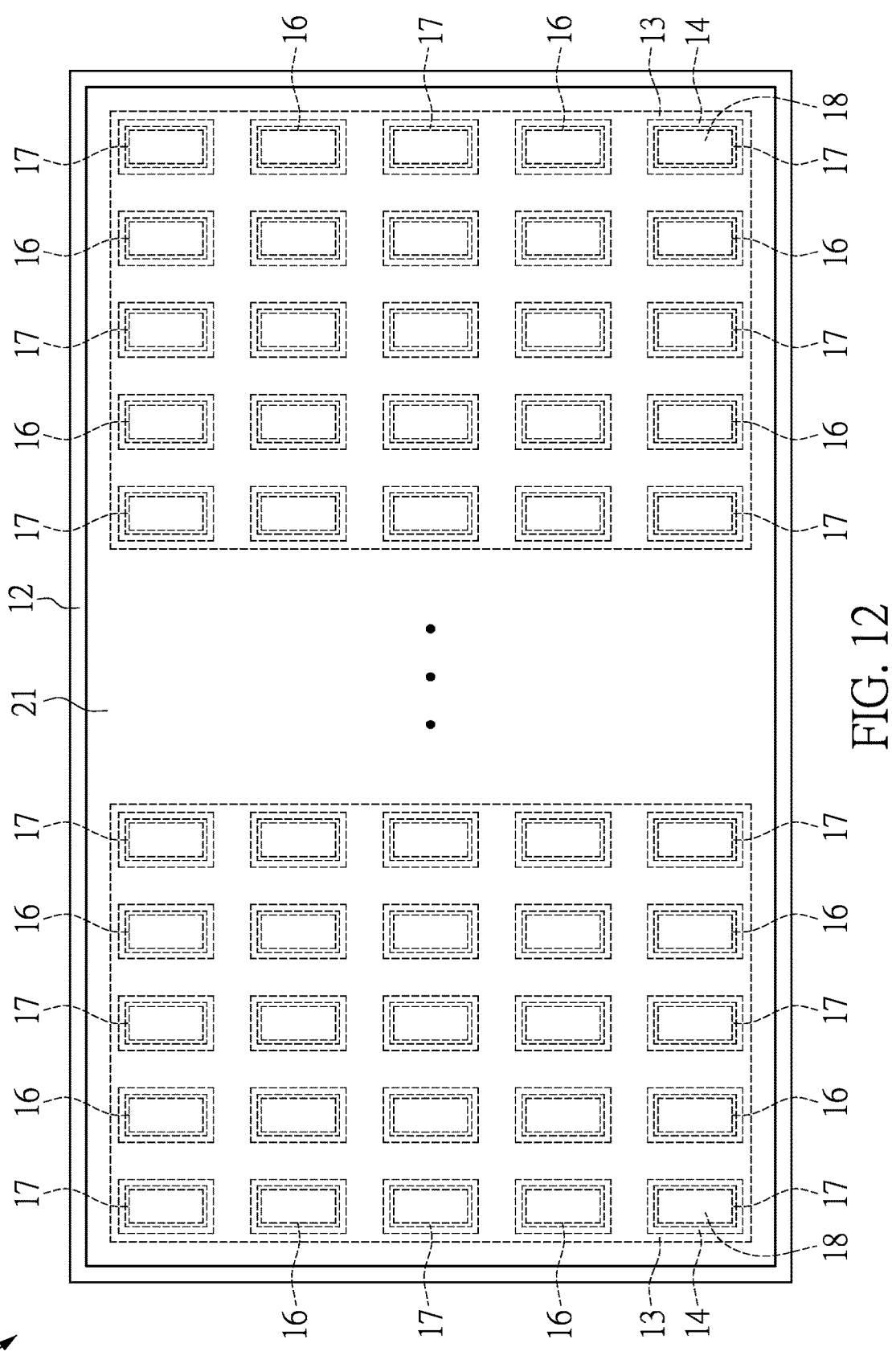
FIG. 12 is a schematic top view of the power device according to one embodiment of the present disclosure.
Figure 13:
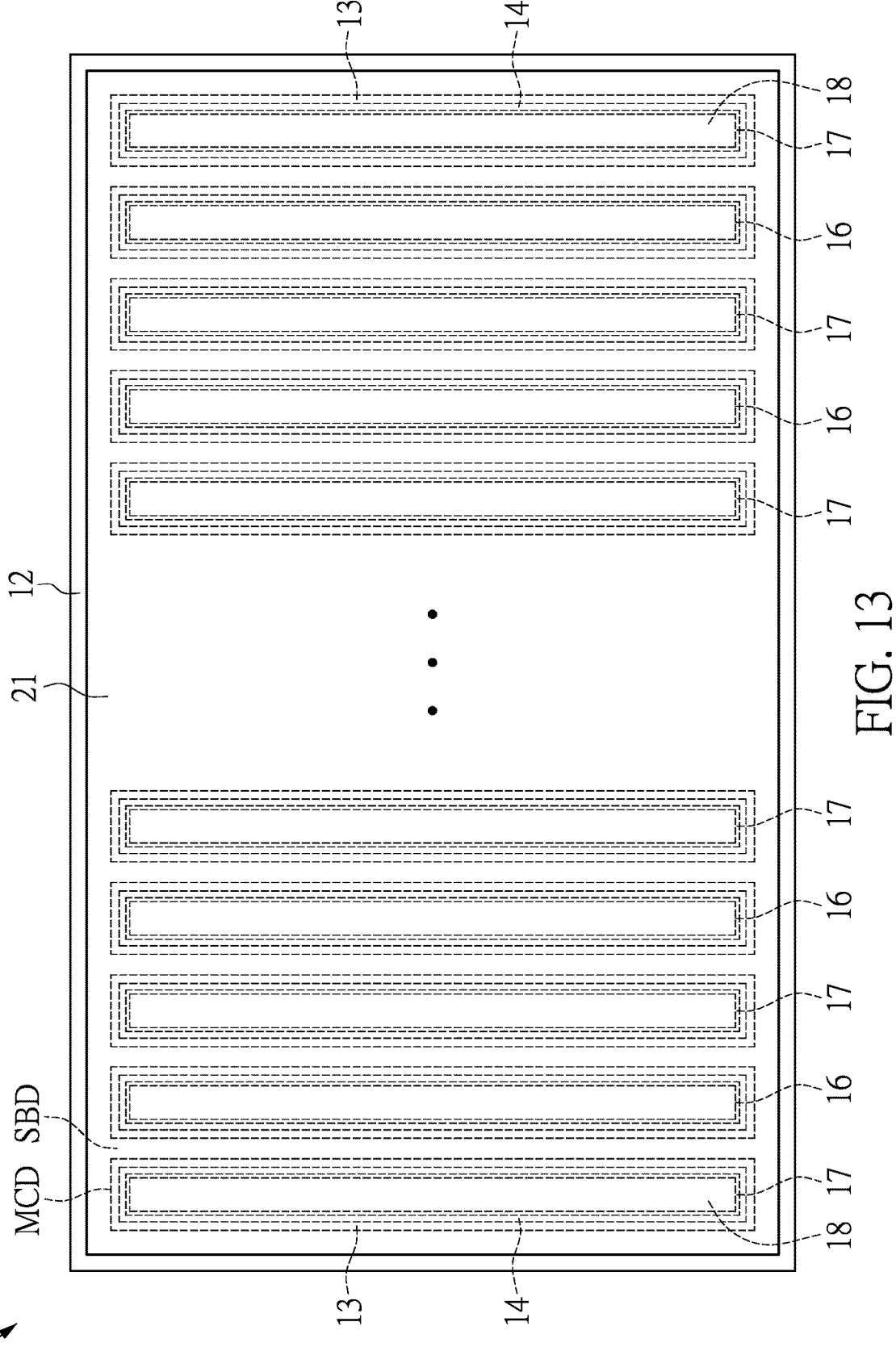
FIG. 13 is a schematic top view of the power device according to one embodiment of the present disclosure.
Figure 14:
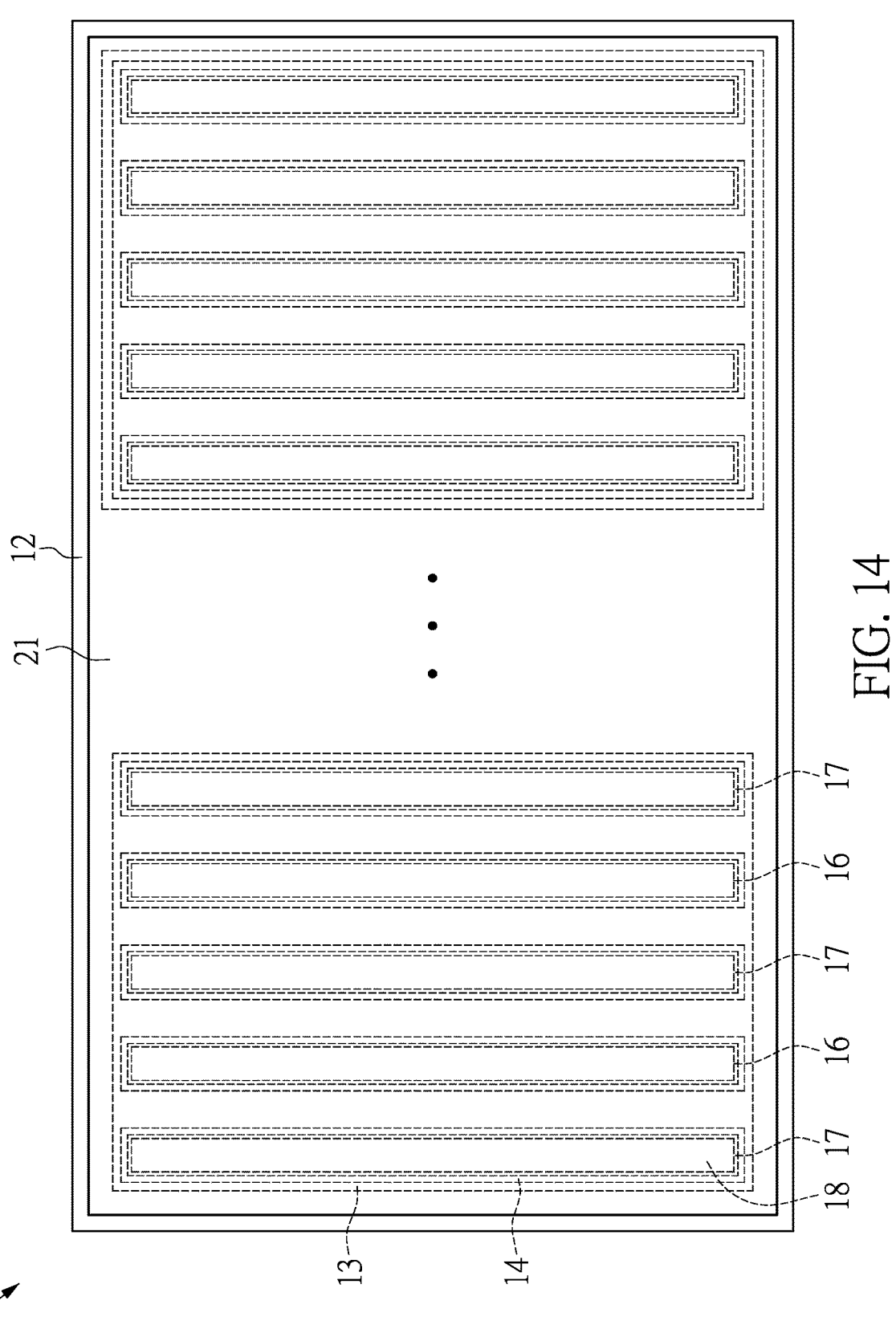
FIG. 14 is a schematic top view of the power device according to one embodiment of the present disclosure.

Referring to FIG. 11 to FIG. 14, FIG. 11 to FIG. 14 are schematic top views of the power device 1 according to one embodiment of the present disclosure. In the embodiment as shown in FIG. 11, the source regions and the gate regions are alternately arranged, and half of the surface regions of the power device 1 are source regions. Any two adjacent MOS channel diodes are spaced apart by a gate region, and a Schottky diode is located between a source region and a gate region. One of the differences between the embodiment as shown in FIG. 12 and the embodiment as shown in FIG. 11 is that the embodiment as shown in FIG. 12 does not have Schottky diodes, while the embodiment of FIG. 11 has multiple MOS channel diodes. In the embodiment as shown in FIG. 13, the source regions and the gate regions are strip-shaped and are alternately arranged. Any two adjacent MOS channel diodes are spaced apart by a gate region, and a Schottky diode is located between a source region and a gate region. One of the differences between the embodiment as shown in FIG. 14 and the embodiment as shown in FIG. 13 is that the embodiment as shown in FIG. 14 does not have Schottky diodes, while the embodiment of FIG. 13 has multiple MOS channel diodes.

Beneficial Effects of the Embodiments

In conclusion, in the power device 1 and the method S100 for manufacturing the power device 1 of the present disclosure, by virtue of "implanting a fifth electrically conductive dopant below a bottom surface of the source trench 152 to form a shielding region 19," a piezoelectric field below a source and a gate can be decreased.

Furthermore, in the power device 1 and the method S100 for manufacturing the power device 1 of the present disclosure, by virtue of "forming a metallic channel diode by using the metallic electrically conductive layer 21, the well region 13, the doping regions 14, the source regions, the shielding regions 19, the epitaxial layer 12, and the electrical substrate 11," the metallic channel diode having a lower threshold voltage can be used in place of the P-N junction of a silicon carbide metal oxide semiconductor field-effect transistor, so that a forward bias of the source can be decreased.

Moreover, in the power device 1 and the method S100 for manufacturing the power device 1 of the present disclosure, by virtue of "the well region 13 being plural in number, and a Schottky diode being formed by the metallic electrically conductive layer 21, a region between two well regions 13, the epitaxial layer 12, and the electrical substrate 11," the Schottky diode has a forward bias that is lower than 1.7 V, so that a turn-on voltage required by the circuitry of the power device may be lowered.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power device, comprising:

an electrical substrate being doped with a first electrically conductive dopant, wherein the electrical substrate has a first surface and a second surface that is opposite to the first surface;

an epitaxial layer being located on the first surface, wherein the epitaxial layer is doped with a second electrically conductive dopant that has same electrical charges as the first electrically conductive dopant, and a concentration of the second electrically conductive dopant is lower than a concentration of the first electrically conductive dopant; wherein the epitaxial layer has an implantation surface;

a well region being located below the implantation surface and doped with a third electrically conductive dopant, wherein the third electrically conductive dopant and the first electrically conductive dopant have different electrical charges;

a plurality of doping regions being located in the well region and doped with a fourth electrically conductive dopant, wherein the plurality of doping regions are positioned directly below and in contact with the implantation surface, the fourth electrically conductive dopant and the first electrically conductive dopant have same electrical charges, and any two adjacent ones of the doping regions are spaced apart from each other;

a plurality of trenches, wherein each of the plurality of trenches penetrates downwardly from the implantation surface and through the well region and the doping region and protrudes out from the well region; wherein, in three adjacent ones of the trenches, the trench that is located in middle is defined as a gate trench, and the two trenches that are located at two sides of the gate trench are each defined as a source trench;

a first oxidation layer located on an inner wall of the gate trench;

a second oxidation layer located on inner walls of the two source trenches, wherein a thickness of the second oxidation layer is less than a thickness of the first oxidation layer;

a polycrystalline silicon filler being filled in the gate trench and the two source trenches to form a gate region in the gate trench and form a source region in each of the two source trenches;

two shielding regions respectively located below bottom surfaces of the two source trenches; wherein each of the two shielding regions is doped with a fifth electrically conductive dopant, and the fifth electrically conductive dopant and the first electrically conductive dopant have different electrical charges;

a dielectric layer being located on the gate trench; and a metallic electrically conductive layer covering the dielectric layer and the well region;

wherein a first sidewall of the gate trench is adjacent to a second sidewall of the source trench, and a distance is present between the doping region connected to the first sidewall and the doping region connected to the second sidewall.

2. The power device according to claim 1, wherein the well region is plural in number, and two adjacent ones of the well regions are spaced apart by a gap.

3. The power device according to claim 1, wherein the electrical substrate is a silicon carbide substrate, and the first electrically conductive dopant is an N-type dopant.

4. The power device according to claim 1, wherein the thickness of the first oxidation layer is from 40 nm to 60 nm, and the thickness of the second oxidation layer is from 1 nm to 10 nm.

5. The power device according to claim 2, wherein the gap is from 0.5 μm to 5 μm, a depth of each of the trenches is from 0.5 μm to 5 μm, and a width of each of the trenches is from 0.3 μm to 3 μm.

* * * * *